(12) United States Patent
Liu et al.

(10) Patent No.: US 7,837,903 B2
(45) Date of Patent: Nov. 23, 2010

(54) POLYTHIOPHENES AND ELECTRONIC DEVICES COMPRISING THE SAME

(75) Inventors: Ping Liu, Mississauga (CA); Yiliang Wu, Oakville (CA); Yuning Li, Singapore (PH)

(73) Assignee: Xerox Corporation, Norwalk, CT (US)

( * ) Notice: Subject to any disclaimer, the term of this patent is extended or adjusted under 35 U.S.C. 154(b) by 78 days.

(21) Appl. No.: 12/331,794

(22) Filed: Dec. 10, 2008

(65) Prior Publication Data
US 2010/0140555 A1    Jun. 10, 2010

(51) Int. Cl.
*H01B 1/12* (2006.01)
(52) U.S. Cl. .................. 252/500; 528/373; 528/377
(58) Field of Classification Search .......... 252/500; 528/373, 377; 549/29; 257/40
See application file for complete search history.

(56) References Cited

U.S. PATENT DOCUMENTS

| | | | |
|---|---|---|---|
| 6,770,904 B2 * | 8/2004 | Ong et al. ............... | 257/40 |
| 6,872,801 B2 | 3/2005 | Ong et al. | |
| 6,890,868 B2 | 5/2005 | Wu et al. | |
| 6,949,762 B2 | 9/2005 | Ong et al. | |
| 7,132,500 B2 | 11/2006 | Ong et al. | |
| 7,141,644 B2 * | 11/2006 | Ong et al. ............... | 528/373 |
| 7,250,625 B2 * | 7/2007 | Ong et al. ............... | 257/40 |
| 7,282,733 B2 * | 10/2007 | Ong et al. ............... | 257/40 |
| 7,517,945 B2 * | 4/2009 | Ong et al. ............... | 528/373 |
| 2009/0256138 A1 | 10/2009 | Wu et al. | |

FOREIGN PATENT DOCUMENTS

EP    1679330 A1 *  12/2006

* cited by examiner

Primary Examiner—Mark Kopec
(74) Attorney, Agent, or Firm—Fay Sharpe LLP

(57) ABSTRACT

Disclosed are semiconducting polythiophenes comprising a repeating unit of Formula (A) or a copolythiophene of Formula (B):

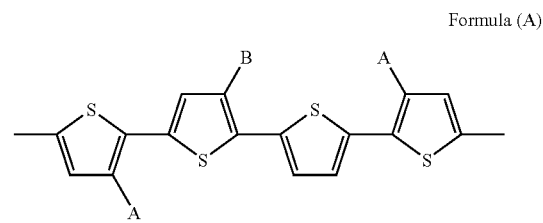

Formula (A)

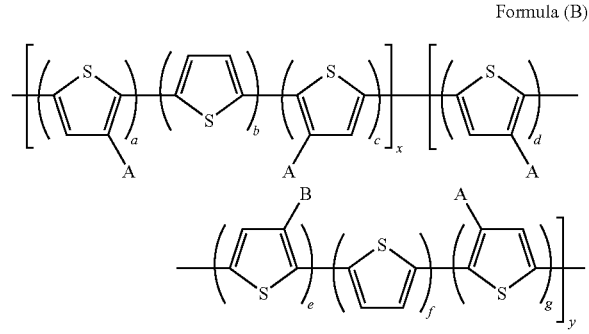

Formula (B)

wherein A and B are each alkyl having from 1 to about 25 carbon atoms; and a, b, c, d, e, f, g, x, and y are as defined herein. These polythiophenes have high mobility and are soluble in common organic solvents, so that chlorinated solvents do not need to be used. They are useful for depositing semiconducting layers, particularly in organic thin-film transistors.

22 Claims, 2 Drawing Sheets

POLYTHIOPHENES AND ELECTRONIC DEVICES COMPRISING THE SAME

BACKGROUND

The present disclosure relates, in various embodiments, to compositions and processes suitable for use in electronic devices, such as thin film transistors ("TFT"s). The present disclosure also relates to components or layers produced using such compositions and processes, as well as electronic devices containing such materials.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible. Organic thin film transistors (OTFTs) may be suited for those applications not needing high switching speeds or high densities.

The performance of a TFT can be measured by at least three properties: the mobility, current on/off ratio, and threshold voltage. The mobility is measured in units of $cm^2/V \cdot sec$; higher mobility is desired. A higher current on/off ratio is also desired. Threshold voltage relates to the bias voltage needed to be applied to the gate electrode in order to allow current to flow. Generally, a threshold voltage as close to zero (0) as possible is desired.

Most high-performance organic semiconductors suffer from either (1) significant degradation of their electrical properties when exposed to air; or (2) poor solution processability. Some solution-processable, high-performance polythiophene semiconductors are known for electronic device applications. For example, described in U.S. Pat. Nos. 6,770,904; 7,132,500; 7,282,733; 7,250,625; and 7,141,644 (all of which are hereby fully incorporated by reference) is the use of a semiconducting polythiophene referred to as PQT-12:

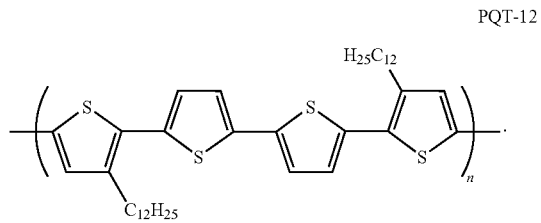

PQT-12

Generally speaking, the long pendant alkyl sidechains impart high solubility to the polythiophene. Excellent field-effect transistor (FET) properties have been achieved in OTFTs using this polythiophene and fabricated in ambient conditions.

PQT-12 also has a high self-assembly capability. Like most high-mobility solution-processable semiconductors, this strong self-assembly capability stems from the regioregular placement of the long pendant side-chains along the backbone, which promotes extensive lamellar ordering, as shown in FIG. 1.

However, PQT-12 is not sufficiently soluble in most common organic solvents. As a result, it requires processing in environmentally undesirable chlorinated solvents, such as chlorobenzene or dichlorobenzene, for optimal performance. Unfortunately, this also results in gelation of the solution at room temperature. This is a problem because a deposition solution is generally desired for ease of applying the polythiophene to an organic TFT. U.S. Pat. No. 6,890,868, which is hereby fully incorporated by reference, describes one solution to the gelation problem by elevating the temperature of the deposition solution. This approach still requires the use of chlorinated aromatic solvents for processing to obtain optimum performance, thus severely limiting its general application in manufacturing environments.

It would be desirable to eliminate chlorinated solvents from the manufacturing process.

BRIEF DESCRIPTION

The present disclosure is directed, in various embodiments, to polythiophenes which do not require the use of chlorinated solvents to achieve high solubility. These polythiophenes also have high mobility and good on/off ratio performance.

Disclosed in embodiments is a polythiophene comprising a repeating unit of Formula (A):

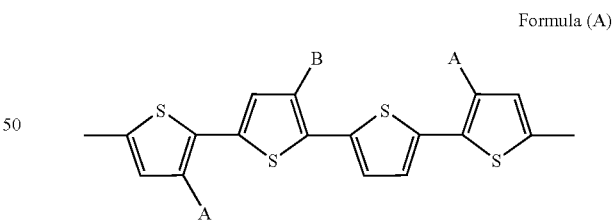

Formula (A)

wherein A and B are independently alkyl having from 1 to about 25 carbon atoms.

A may be alkyl having from 6 to about 25 carbon atoms, including from 8 to about 12 carbon atoms. In specific embodiments, A is n-$C_{12}H_{25}$. B may be alkyl having from 1 to about 4 carbon atoms. In specific embodiments, B is methyl. In others, A is n-$C_{12}H_{25}$ and B is methyl. A may be longer than B. The polythiophene may have a weight average molecular weight of from about 2,000 to about 200,000.

Disclosed in other embodiments is a copolythiophene of Formula (B):

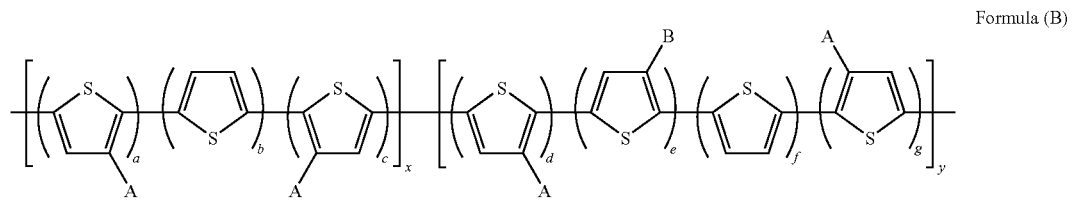

wherein A and B are each alkyl having from 1 to about 25 carbon atoms; A is longer than B; a, b, c, d, e, f, and g are each from 1 to about 7; y is greater than 0; and x and y together equal 100 mole percent.

In some embodiments, a, c, d, e, f, and g are each 1; and b is 2. The variable x may be from about 50 to about 90 mole percent. In particular embodiments, A is n-$C_{12}H_{25}$ and B is methyl.

Also disclosed is an electronic device having a semiconducting layer, wherein the semiconducting layer comprises a polythiophene of Formula (A):

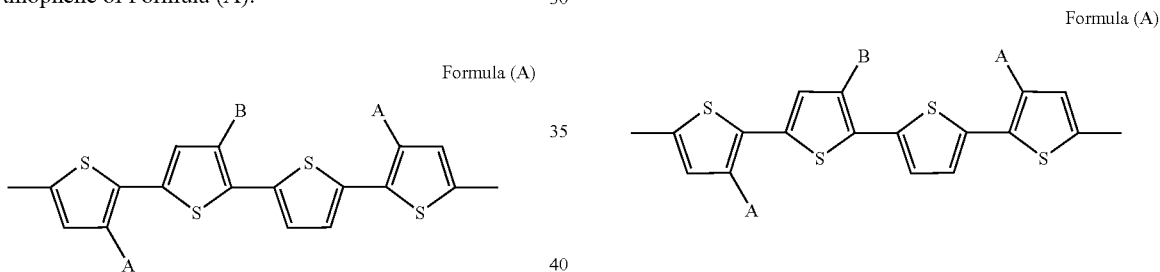

wherein A and B are independently alkyl having from 1 to about 25 carbon atoms.

Also disclosed is an electronic device having a semiconducting layer, wherein the semiconducting layer comprises a copolythiophene of Formula (B):

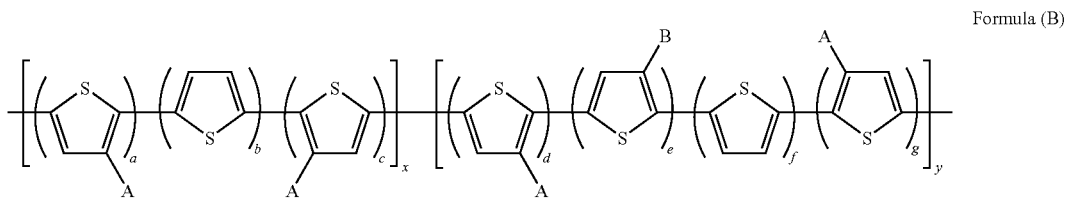

wherein A and B are each alkyl having from 1 to about 25 carbon atoms; A is longer than B; a, b, c, d, e, f, and g are each from 1 to about 7; y is greater than 0; and x and y together equal 100 mole percent.

In other embodiments is disclosed a deposition solution comprising: a non-chlorinated solvent; and a polythiophene comprising a repeating unit of Formula (A):

wherein A and B are each alkyl having from 1 to about 25 carbon atoms; and A is longer than B.

Also disclosed in other embodiments is a deposition solution comprising: a non-chlorinated solvent; and a copolythiophene of Formula (B):

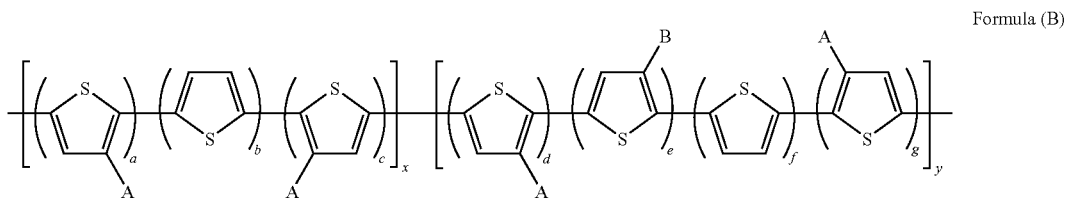

Formula (B)

wherein A and B are each alkyl having from 1 to about 25 carbon atoms; A is longer than B; a, b, c, d, e, f, and g are each from 1 to about 7; y is greater than 0; and x and y together equal 100 mole percent.

The non-chlorinated solvent may be toluene, xylene, mesitylene, trimethylbenzene, tetrahydrnapththalene, ethylbenzene, diethylbenzene, propylbenzene, or ethyl toluene.

Also included in further embodiments are deposition solutions comprising the semiconducting polythiophene; the semiconducting layers and/or thin film transistors produced therefrom; and methods of making and using such polythiophenes as described herein.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
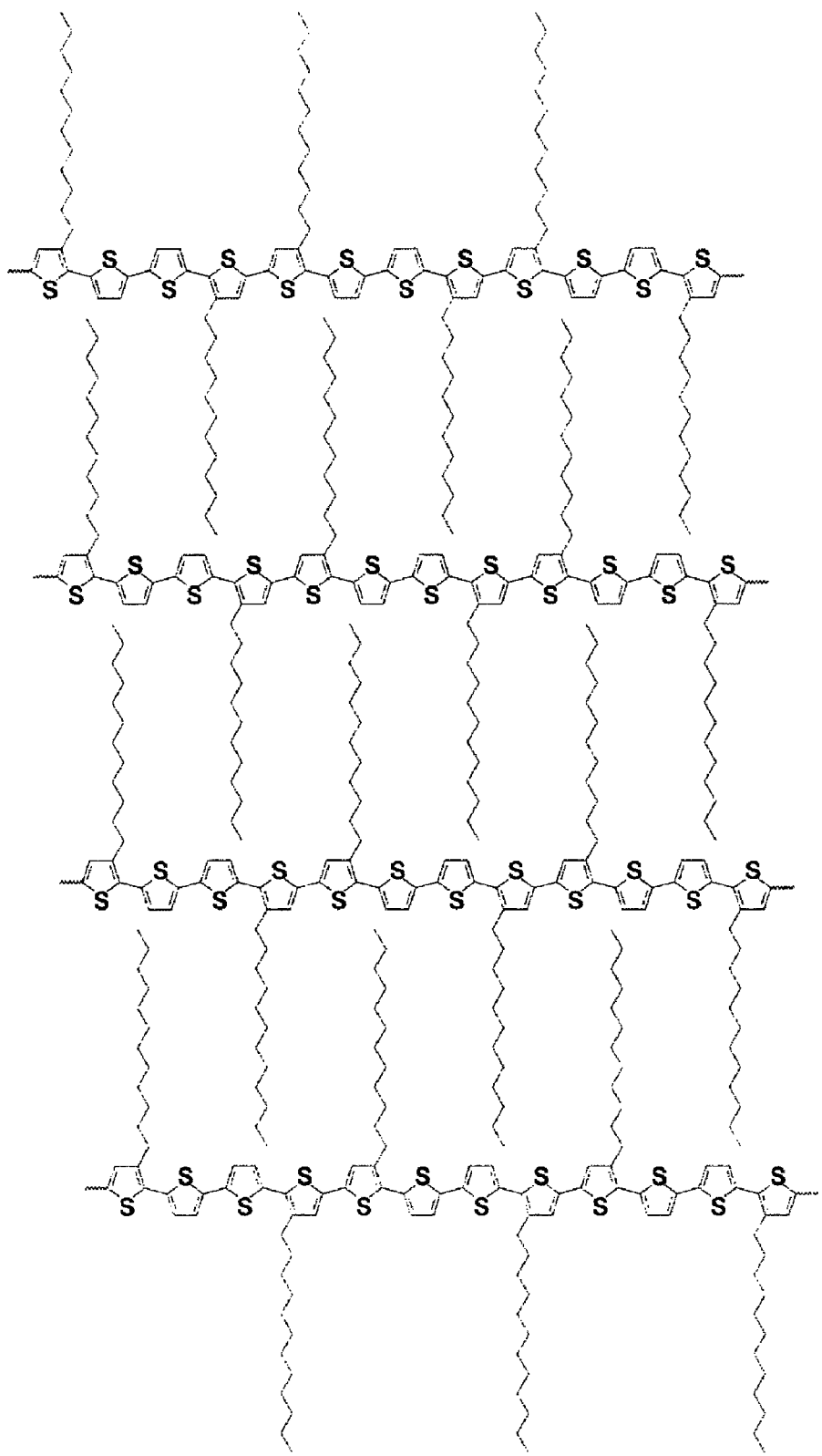
FIG. 1 illustrates lamellar ordering of regioregular polythiophenes.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

Figure 2:
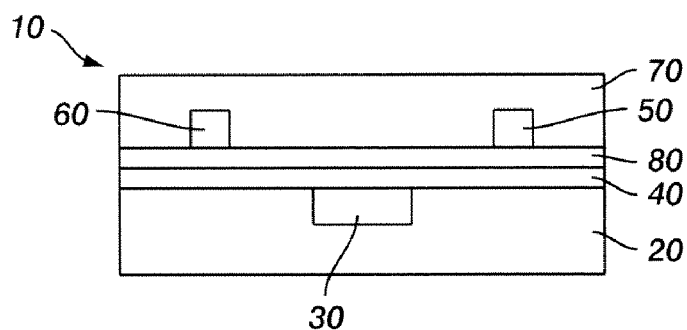
FIG. 2 is a first exemplary embodiment of a TFT of the present disclosure.

FIG. 2 illustrates a first OTFT embodiment or configuration. The OTFT 10 comprises a substrate 20 in contact with the gate electrode 30 and a dielectric layer 40. Although here the gate electrode 30 is depicted within the substrate 20, this is not required. However, of some importance is that the dielectric layer 40 separates the gate electrode 30 from the source electrode 50, drain electrode 60, and the semiconducting layer 70. The source electrode 50 contacts the semiconducting layer 70. The drain electrode 60 also contacts the semiconducting layer 70. The semiconducting layer 70 runs over and between the source and drain electrodes 50 and 60. Optional interfacial layer 80 is located between dielectric layer 40 and semiconducting layer 70.

Figure 3:
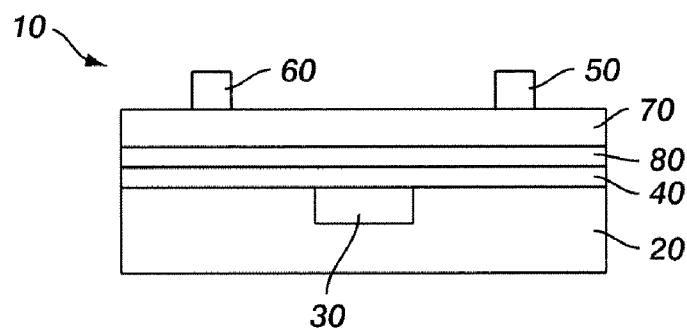
FIG. 3 is a second exemplary embodiment of a TFT of the present disclosure.

FIG. 3 illustrates a second OTFT embodiment or configuration. The OTFT 10 comprises a substrate 20 in contact with the gate electrode 30 and a dielectric layer 40. The semiconducting layer 70 is placed over or on top of the dielectric layer 40 and separates it from the source and drain electrodes 50 and 60. Optional interfacial layer 80 is located between dielectric layer 40 and semiconducting layer 70.

Figure 4:
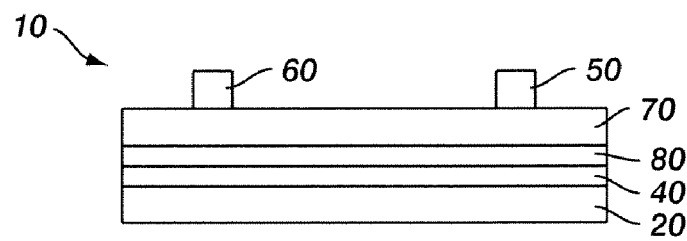
FIG. 4 is a third exemplary embodiment of a TFT of the present disclosure.

FIG. 4 illustrates a third OTFT embodiment or configuration. The OTFT 10 comprises a substrate 20 which also acts as the gate electrode and is in contact with a dielectric layer 40. The semiconducting layer 70 is placed over or on top of the dielectric layer 40 and separates it from the source and drain electrodes 50 and 60. Optional interfacial layer 80 is located between dielectric layer 40 and semiconducting layer 70.

Figure 5:
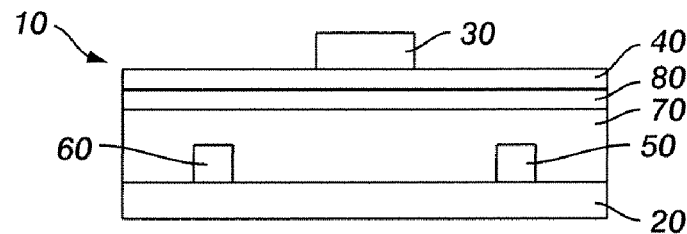
FIG. 5 is a fourth exemplary embodiment of a TFT of the present disclosure.

FIG. 5 illustrates a fourth OTFT embodiment or configuration. The OTFT 10 comprises a substrate 20 in contact with the source electrode 50, drain electrode 60, and the semiconducting layer 70. The semiconducting layer 70 runs over and between the source and drain electrodes 50 and 60. The dielectric layer 40 is on top of the semiconducting layer 70. The gate electrode 30 is on top of the dielectric layer 40 and does not contact the semiconducting layer 70. Optional interfacial layer 80 is located between dielectric layer 40 and semiconducting layer 70.

It has been found that the self-organizing capability of polythiophenes, such as PQT-12, in solution can be greatly suppressed or even eliminated by slightly perturbing the structural regioregularity of the polythiophene via incorporation of a small substituent in the intervening thienylene moieties. In particular, although this slight structural modification prevents gelation of the polythiophene in solution, the polythiophene still has a strong tendency to self-assemble in the solid state, so that high mobility is still obtained. Thus, the solubility of the polythiophene can be tuned while high mobility is still achieved.

The semiconducting polythiophenes of the present disclosure comprise a repeating unit of Formula (A):

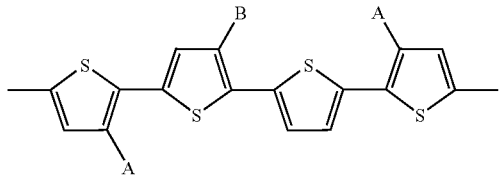

Formula (A)

wherein A and B are each alkyl having from 1 to about 25 carbon atoms; and A is longer than B.

In particular embodiments, A is alkyl having from 6 to about 25 carbon atoms, including from 8 to about 12 carbon atoms. In specific embodiments, A is n-$C_{12}H_{25}$. In particular embodiments, B is alkyl having from 1 to about 4 carbon atoms. In specific embodiments, B is methyl. In further specific embodiments, A is n-$C_{12}H_{25}$ and B is methyl.

The semiconducting polythiophene may have a weight average molecular weight of from about 2,000 to about 200,000, including from about 5,000 to about 100,000.

In more particular embodiments, the polythiophene is a copolythiophene of Formula (B):

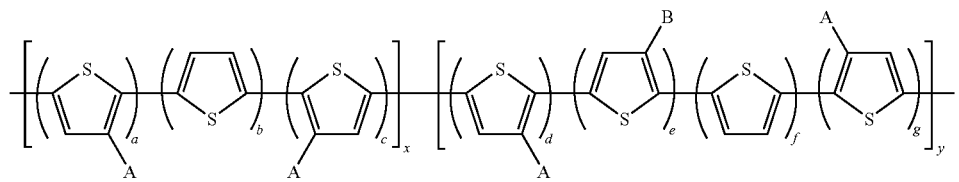

Formula (B)

wherein A and B are each alkyl having from 1 to about 25 carbon atoms; A is longer than B; a, b, c, d, e, f, and g are each from 1 to about 7; y is greater than 0; and x and y together equal 100 mole percent.

The copolythiophene may also have a weight average molecular weight of from about 2,000 to about 200,000, including from about 5,000 to about 100,000.

In Formula (B), A can be n-$C_{12}H_{25}$ and B can be methyl. In particular embodiments, a, c, d, e, f, and g are each 1, and b is 2. The variable x may be from about 5 to about 95 mole percent, and the variable y may be from about 95 to about 5 mole percent. In more specific embodiments, the variable x is from about 50 to about 95 mole percent, and the variable y is from about 50 to about 5 mole percent.

In particular embodiments, the copolythiophene is of Formula (C):

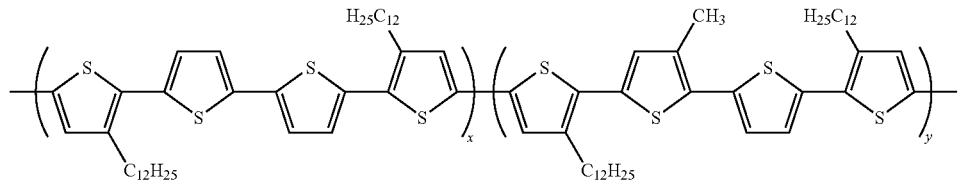

Formula (C)

where both x and y are greater than 0; and x and y together add up to 100 mole percent.

The polythiophenes of the present disclosure can be synthesized using methods known in the art. For example, one such polythiophene can be made as shown in Scheme 1:

Scheme 1

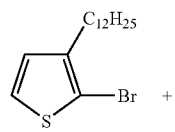

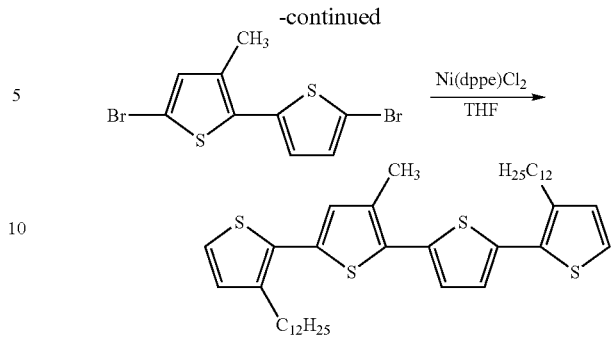

Monomer 1

Polythiophene 1 where Ni(dppe)Cl$_2$ is bis(diphenylphosphinoethane]dichloronickel (II).

Copolythiophenes can be made as shown in Scheme 2:

Scheme 2

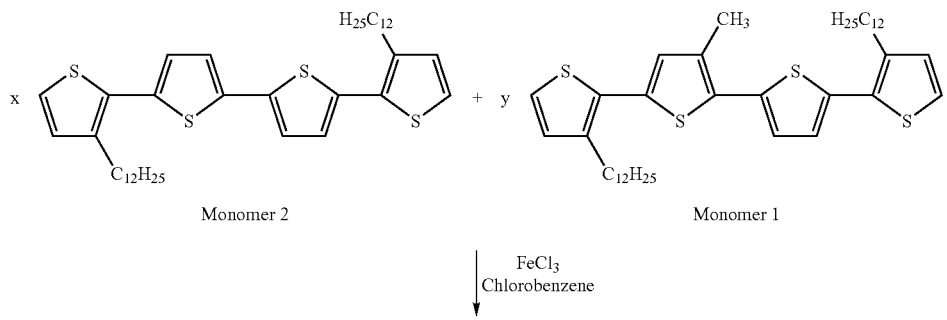

Monomer 2          Monomer 1

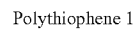

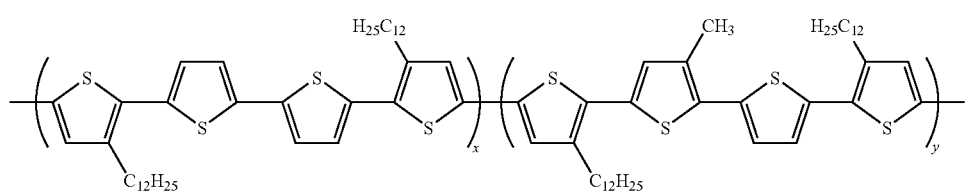

Copolythiophene 2

Because the solubility of the polythiophenes of the present disclosure can be tuned, more common organic solvents can be used to form a deposition solution. The solvents may include, but are not limited to, toluene, xylene, mesitylene, trimethylbenzene, ethylbenzene, ethyl toluene, propylbenzene, diethylbenzene, tetrahydronaphthalene, chlorobenzene, and dichlorobenzene. In other embodiments, nonchlorinated solvents can be used. Exemplary nonchlorinated solvents include toluene, xylene, mesitylene, trimethylbenzene, ethylbenzene, ethyl toluene, propylbenzene, tetrahydronaphthalene, and diethylbenzene.

The deposition solution may be used to deposit the polythiophene to form a semiconducting layer, for example in electronic devices such as thin-film transistors.

TFTs are generally composed of a supporting substrate, three electrically conductive electrodes (gate, source and drain electrodes), a channel semiconducting layer, and an electrically insulating gate dielectric layer separating the gate electrode from the semiconducting layer.

If desired, the semiconducting layer may further comprise another organic semiconductor material. Examples of other organic semiconductor materials include but are not limited to acenes, such as anthracene, tetracene, pentacene, and their substituted derivatives, perylenes, fullerenes, oligothiophenes, other semiconducting polymers such as triarylamine polymers, polyindolocarbazole, polycarbazole, polyacenes, polyfluorene, phthalocyanines such as copper phthalocyanines or zinc phthalocyanines and their substituted derivatives.

The semiconducting layer is from about 5 nm to about 1000 nm thick, especially from about 10 nm to about 100 nm thick. The semiconducting layer can be formed by any suitable method. However, the semiconducting layer is generally formed from a liquid composition, such as a dispersion or solution, and then deposited onto the substrate of the transistor. Exemplary deposition methods include liquid deposition such as spin coating, dip coating, blade coating, rod coating, screen printing, stamping, ink jet printing, and the like, and other conventional processes known in the art.

The substrate may be composed of materials including, but not limited to, silicon, glass plate, and plastic film or sheets. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers or copolymers include polyesters, polycarbonates, poly(vinylphenol), polyimides, polystyrene, polymethacrylates, polyacrylates, epoxy resin, polyacrylonitrile, polymethacrylonitrile, poly (methyl methacrylates-co-vinylphenol), poly(methacrylates-co-vinylphenol), poly(acrylonitrile-co-methacrylonitrile), and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

If desired, an interfacial layer may be placed between the dielectric layer and the semiconducting layer. As charge transport in an organic thin film transistor occurs at the interface of these two layers, the interfacial layer may influence the TFT's properties. Exemplary interfacial layers may be formed from silanes, such as those described in U.S. patent application Ser. No. 12/101,942, filed Apr. 11, 2008.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconducting layer should both be in contact with the dielectric layer. In addition, the source and drain electrodes should both be in contact with the semiconducting layer. The semiconducting polymer formed by the methods of the present disclosure may be deposited onto any appropriate component of an organic thin-film transistor to form a semiconducting layer of that transistor.

The resulting transistor may have, in embodiments, a mobility of 0.01 cm$^2$/V·sec or greater, including 0.1 cm$^2$/V·sec or more. The current on/off ratio may be 10$^5$ or greater.

The following examples illustrate the devices, polymers, monomers, and methods of the present disclosure. The examples are merely illustrative and are not intended to limit the present disclosure with regard to the materials, conditions, or process parameters set forth therein.

EXAMPLES

Example 1

Poly[5,5'-bis(3-dodecyl-2-thienyl)-3-methyl-2,2'-dithiophene] was prepared as described in Scheme 1. This polythiophene corresponds to Polythiophene 1 of Scheme 1 set forth above.

Preparation of Monomer:

A solution of 2-bromo-3-dodecylthiophene (15.36 grams, 46.36 mmol) in 30 milliliters of anhydrous tetrahydrofuran (THF) was added slowly over a period of 20 minutes to a magnetically stirred suspension of magnesium turnings (1.69 grams, 69.52 mmol) in 10 milliliters of THF in a 250 milliliter round-bottomed flask under an inert argon atmosphere. The resultant mixture was stirred at room temperature for 2.5 hours, and then at 50° C. for 30 minutes before cooling down to room temperature.

The resulting fresh prepared Grignard reagent, 3-dodecyl-2-thiophenemagnesium bromide, was then added via a cannula to a mixture of 5,5'-dibromo-3-methyl-2,2'-dithiophene (6.27 grams, 18.54 mmol) and Ni(dppe)Cl$_2$ (0.48 gram, 0.91 mmol) in 50 milliliters of anhydrous THF in a 250 milliliter round-bottomed flask under an inert atmosphere, and refluxed for 48 hours. Subsequently, the reaction mixture was diluted with 200 milliliters of ethyl acetate, was washed twice with water and dried with magnesium sulphate. A dark brown syrup, obtained after evaporation of the solvent, was purified by column chromatography on silica gel and recrystalized from a mixture of methanol and isopropanol yielding 8.61 gram (68%) of 5,5'-bis(3-dodecyl-2-thienyl)-3-methyl-2,2'-dithiophene (Monomer 1 in Scheme 1) as a orange yellow crystalline product (m.p.=34° C.).

$^1$H NMR (CDCl$_3$): δ 7.19 (m, 2H), 7.10 (m, 2H), 6.95(m, 3H), 2.80 (t, 4H), 2.43 (s, 3H), 1.67 (q, 1.65, 4H), 1.28 (bs, 36H), 0.89 (m, 6H).

Preparation of polymer:

Poly[5,5'-bis(3-dodecyl-2-thienyl)-3-methyl-2,2'-dithiophene], polythiophene 1, was prepared using a similar procedure as the ferric chloride method described in U.S. Pat. No. 6,770,904. The final polythiophene product was purifed by soxhlet extraction with hexane, and then with chlorobenzene. The yield of the polymer was 57% and the molecular weight was Mw=29,200 and Mn=14,800.

Example 2

Three copolythiophenes were prepared according to Scheme 2 as set forth above. Monomer 2 was prepared by the method described in U.S. Pat. No. 6,770,904. Monomer 1 was prepared by the method described in Example 1.

For Copolythiophene 2a, x=90 mole % and y=10 mole %.
For Copolythiophene 2b, x=80 mole % and y=20 mole %.
For Copolythiophene 2c, x=50 mole % and y=50 mole %.

For Copolythiophene 2a, a solution of mixed 5,5'-bis(3-dodecyl-2-thienyl)-2,2'-dithiophene (Monomer 2) (500 mg, 0.75 mmol) and 5,5'-bis(3-dodecyl-2-thienyl)-3-methyl-2,2'-dithiophene (Monomer 1) (57 mg, 0.084 mmol) in 10 milliliters of chlorobenzene was added slowly over a period of about 5 minutes to a well stirred mixture of FeCl$_3$ (500 mg, 3.08 mmol) in 5 milliliters of chlorobenzene in a 100 milliliter round-bottomed flask in an inert argon atmosphere. This mixture was stired at 60° C. for 48 hours. After the polymerization, the mixture was diluted with 50 milliliters of methylene chloride and washed three times with water. The separated organic phase was stirred with 150 milliliters of 7.5 percent of an aqueous ammonia solution for 1 hour, washed with water until the water phase is clear, and then poured into methanol to precipitate the crude copolymer. The final copolymer product was purified by soxhlet extraction with heptane, and then with chlorobenzene.

Copolythiophene 2a had a Mw=30,600 and Mn=17,400 relative to polystyrene standards. The yield after purification was 86%.

Copolythiophenes 2b and 2c were similarly prepared.

Copolythiophene 2b had a Mw=21,500 and Mn=15,400 relative to polystyrene standards. The yield after purification was 79%.

Copolythiophene 2c had a Mw=21,600 and Mn=10,900 relative to polystyrene standards. The yield after purification was 68%.

Comparative Example

For comparative purposes, the baseline polythiophene was PQT-12, poly(3,3'''-didodecylquaterthiophene). PQT-12 was previously described in U.S. Pat. No. 6,770,904.

Comparison and Results

Deposition solutions were made. The Polythiophene 1 of Example 1; and the Copolythiophenes 2a, 2b, and 2c of Example 2 were dissolved in xylene. PQT-12 of the Comparative Example was dissolved in dichlorobenzene. The solutions contained 0.3-1 wt % of the polythiophene.

Organic thin-film transistors (OTFTs) were then made using the deposition solutions. The fabrication and characterization of the OTFTs was done under ambient conditions without taking any precautions to isolate the materials and devices from exposure to air, moisture, or light.

Bottom-gate TFT devices were built using an n-doped silicon wafer as the substrate and the gate electrode with a 110-nm thermal silicon oxide (SiO$_2$) as the dielectric layer.

The SiO₂ surface was modified with octyltrichlorosilane (OTS-8) by immersing a cleaned silicon wafer substrate in 0.1 M OTS-8 in toluene at 60° C. for 20 minutes. The wafer was subsequently rinsed with toluene and isopropanol, and then dried with an air stream.

The semiconductor layer was deposited on the OTS-8-modified SiO₂ layer by spin coating a deposition solution at 1000 rpm for 120 seconds, then vacuum drying to give a 20-50 nm-thick semiconductor layer.

Subsequently, the gold source and drain electrodes were deposited by vacuum evaporation through a shadow mask, thus creating a series of TFTs with various channel length (L) and width (W) dimensions. All the devices were annealed by heating the dried TFT devices in a vacuum oven at 120-140° C. for 15 to 30 minutes and then cooled down to room temperature.

Patterned transistors with channel length of 90 or 190 microns and channel width of 1 or 5 mm were used for current/voltage measurements. The TFT devices were then evaluated using a Keithley SCS-4200 characterization system under ambient conditions.

The field effect mobility for all the TFTs were extracted from the saturated regimes using the following equation:

Saturated regime: $I_D = C_i \mu (W/2L)(V_G - V_T)^2$ where $I_D$ is the drain current, $C_i$ is the capacitance per unit area of the gate dielectric layer, W and L are the width and length of the channel, and $V_G$ and $V_T$ are the gate voltage and threshold voltage respectively. The mobilities and current On/Off ratios of the OTFTs are summarized in Table 1.

TABLE 1

| Polythiophene | Mobility (cm²/V · sec) | | Current On/Off Ratio | |
|---|---|---|---|---|
| | Before annealing | After annealing | Before annealing | After annealing |
| PQT-12 | 0.03-0.05 | 0.10-0.2 | $10^6$ | $10^7$ |
| Copolythiophene 2a (x = 90%) | 0.03-0.04 | 0.10-0.2 | $10^6$ | $10^7$ |
| Copolythiophene 2b (x = 80%) | 0.02-0.03 | 0.05-0.07 | $10^6$ | $10^6$ |
| Copolythiophene 2c (x = 50%) | 0.03-0.04 | 0.03-0.05 | $10^6$ | $10^6$ |
| Polythiophene 1 | 0.01-0.02 | 0.02-0.03 | $10^6$ | $10^6$ |

The experimental results showed that a coating solution of PQT-12 in xylene was not stable; it immediately gelled when cooled to room temperature. Therefore, dichlorobenzene was used for the PQT-12 coating solution. The results showed that xylene could be used as a coating solvent for Polythiophene 1 and Copolythiophenes 2a, 2b, and 2c. In other words, the solubility of Polythiophene 1 and Copolythiophenes 2a, 2b, and 2c in xylene was significantly increased.

The OTFT results showed that mobility increased with increasing amounts of monomer 2, which was consistent with the gradual increase in crystallinity. On the other hand, the solubility increased gradually with increasing amounts of monomer 1.

Our results also showed that copolythiophene 2a not only had much better solubility than PQT-12, but also exhibited high mobility of 0.10-0.18 cm²/V·sec and On/Off ratio of $10^7$ when using xylene as the coating solvent.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A polythiophene comprising a repeating unit of Formula (A):

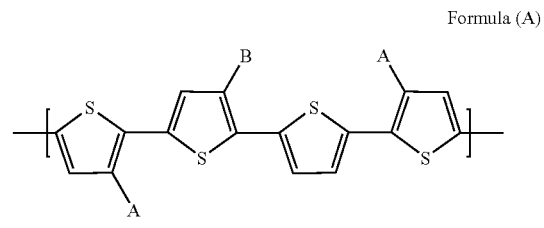

Formula (A)

wherein A and B are independently alkyl having from 1 to about 25 carbon atoms; and A and B are different.

2. The polythiophene of claim 1, wherein A is alkyl having from 6 to about 25 carbon atoms.

3. The polythiophene of claim 1, wherein A is alkyl having from 8 to about 12 carbon atoms.

4. The polythiophene of claim 1, wherein A is n-C₁₂H₂₅.

5. The polythiophene of claim 1, wherein B is alkyl having from 1 to about 4 carbon atoms.

6. The polythiophene of claim 1, wherein B is methyl.

7. The polythiophene of claim 1, wherein A is n-C₁₂H₂₅ and B is methyl.

8. The polythiophene of claim 1, wherein A is longer than B.

9. The polythiophene of claim 1, wherein the polythiophene has a weight average molecular weight of from about 2,000 to about 200,000.

10. A copolythiophene of Formula (B):

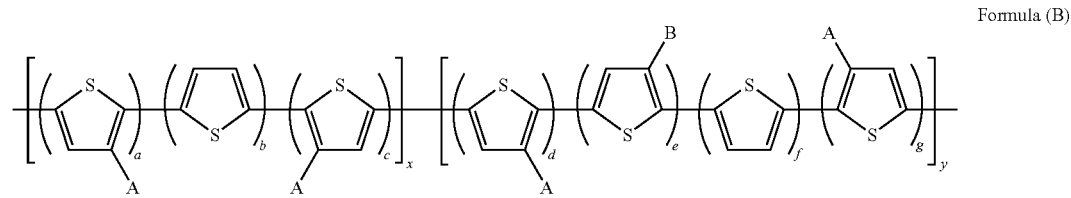

Formula (B)

wherein A and B are each alkyl having from 1 to about 25 carbon atoms; A is longer than B; a, b, c, d, e, f, and g are each from 1 to about 7; y is greater than 0; and x and y together equal 100 mole percent.

11. The copolythiophene of claim 10, wherein a, c, d, e, f, and g are each 1; and b is 2.

12. The copolythiophene of claim 10, wherein x is from about 50 to about 90 mole percent.

13. The copolythiophene of claim 10, wherein A is n-$C_{12}H_{25}$ and B is methyl.

14. An electronic device having a semiconducting layer, wherein the semiconducting layer comprises a polythiophene, the polythiophene comprising a repeating unit of Formula (A):

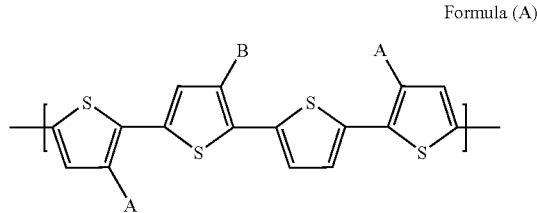

Formula (A)

wherein A and B are independently alkyl having from 1 to about 25 carbon atoms; and A and B are different.

15. The electronic device of claim 14, wherein A is alkyl having from 8 to about 12 carbon atoms.

16. The electronic device of claim 14, wherein B is alkyl having from 1 to about 4 carbon atoms.

17. The electronic device of claim 14, wherein A is n-$C_{12}H_{25}$ and B is methyl.

18. An electronic device having a semiconducting layer, wherein the semiconducting layer comprises a copolythiophene of Formula (B):

19. A deposition solution comprising;

a non-chlorinated solvent; and a polythiophene comprising a repeating unit of Formula (A):

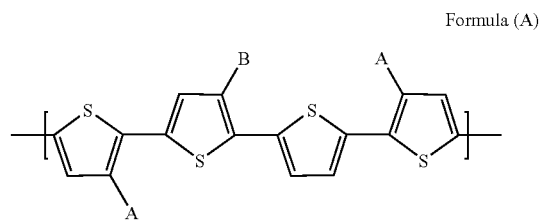

Formula (A)

wherein A and B are each alkyl having from 1 to about 25 carbon atoms; and A is longer than B.

20. The deposition solution of claim 19, wherein the non-chlorinated solvent is selected from the group consisting of toluene, xylene, mesitylene, trimethylbenzene, tetrahydronaphthalene, ethylbenzene, diethylbenzene, propylbenzene, and ethyl toluene.

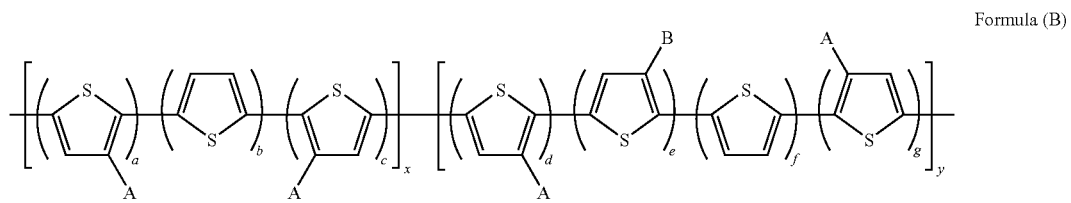

Formula (B)

wherein A and B are each alkyl having from 1 to about 25 carbon atoms; A is longer than B; a, b, c, d, e, f, and g are each from 1 to about 7; y is greater than 0; and x and y together equal 100 mole percent.

21. A deposition solution comprising;

a non-chlorinated solvent; and a copolythiophene of Formula (B):

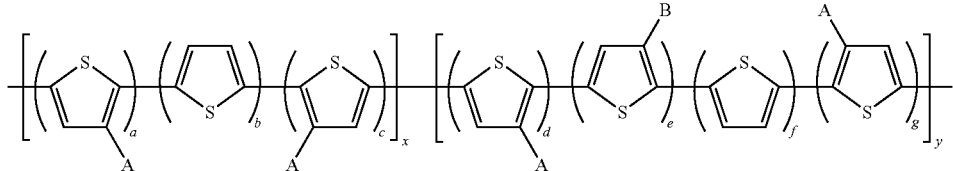

Formula (B)

wherein A and B are each alkyl having from 1 to about 25 carbon atoms; A is longer than B; a, b, c, d, e, f, and g are each from 1 to about 7; y is greater than 0; and x and y together equal 100 mole percent.

22. The deposition solution of claim 21, wherein the non-chlorinated solvent is selected from the group consisting of toluene, xylene, mesitylene, trimethylbenzene, tetrahydronaphthalene, ethylbenzene, diethylbenzene, propylbenzene, and ethyl toluene.

* * * * *